(12) United States Patent
Steckner

(10) Patent No.: US 7,352,182 B1
(45) Date of Patent: Apr. 1, 2008

(54) AUTOMATED SELECTION OF ELEMENTS WITHIN PHASED ARRAY RF COILS

(75) Inventor: Michael Steckner, Richmond Heights, OH (US)

(73) Assignee: Hitachi Medical Systems America, Inc., Twinsburg, OH (US)

( * ) Notice: Subject to any disclaimer, the term of this patent is extended or adjusted under 35 U.S.C. 154(b) by 0 days.

(21) Appl. No.: 11/558,665

(22) Filed: Nov. 10, 2006

(51) Int. Cl.
*G01V 3/00* (2006.01)
(52) U.S. Cl. ........................... 324/309; 324/307
(58) Field of Classification Search ......... 324/300–322
See application file for complete search history.

(56) References Cited

U.S. PATENT DOCUMENTS

| | | | |
|---|---|---|---|
| 5,138,260 A | 8/1992 | Molyneaux et al. | |
| 6,223,065 B1 | 4/2001 | Misic et al. | |
| 6,961,455 B2 * | 11/2005 | Ma et al. | 382/131 |
| 7,218,109 B2 * | 5/2007 | Campagna | 324/309 |

OTHER PUBLICATIONS

Roemer, The NMR Phased Array, Magnetic Resonance in Medicine, 1990, 192-225, 16 (with PubMed Abstract).

* cited by examiner

*Primary Examiner*—Brij Shrivastav
(74) *Attorney, Agent, or Firm*—Buckingham, Doolittle & Burroughs, LLP; Amanda M. Kitzberger

(57) ABSTRACT

Described herein is a method for the automatic selection of elements within at least one radiofrequency coil used for imaging at least one slice of a volume using a magnetic resonance imaging system which includes performing a one-dimensional projection for at least one angle for each element of an initial selection of multiple elements; and using the at least one projection in selecting and/or deselecting at least one element from the group of multiple elements for imaging of the volume. Noise scans can also be utilized to set the receiver channel gain for imaging as part of the method. The elements can also be ranked, commonly using the element's signal to noise ratio, with selection and/or deselection based on the ranking.

16 Claims, 4 Drawing Sheets

AUTOMATED SELECTION OF ELEMENTS WITHIN PHASED ARRAY RF COILS

TECHNICAL FIELD

The invention relates generally to magnetic resonance imaging (MRI) systems, and more specifically to the automated selection of elements within RF coils used with such systems.

BACKGROUND OF THE INVENTION

Magnetic resonance imaging (MRI) is a medical diagnostic imaging technique used to diagnose many types of injuries and medical conditions. An MRI system includes a main magnet for generating a main magnetic field through an examination region. The main magnet is arranged such that its geometry defines the examination region. The main magnetic field causes the magnetic moments of a small majority of the various nuclei within the body to be aligned in a parallel or anti-parallel arrangement. The aligned magnetic moments rotate around the equilibrium axis with a frequency that is characteristic for the nuclei to be imaged. This frequency is called the Larmor frequency. An external radiofrequency (RF) field applied by other hardware within the MRI system perturbs the magnetization from its equilibrium state. Upon termination of the application of the RF pulse, the magnetization relaxes to its initial state. During relaxation the time varying magnetic moment induces a detectable time varying voltage in the receive coil. The time varying voltage can be detected by the receive mode of the transmit coil itself, or by an independent receive only coil. An image processor then reconstructs an image representation from the received magnetic resonance signals for display on a human readable display.

MRI systems, such as system 10 illustrated in FIG. 1 (Prior Art), are made of many hardware components that work in conjunction with specialized software to produce the final images. Magnet 12 is the main hardware component of MRI system 10 and is responsible for producing the uniform main magnetic field, $B_0$. Magnets used in MRI systems are very large and can have a horizontal or a vertical magnetic field. Patient table 14, commonly called the patient couch, extends into bore 16 of magnet 12, and exists to support and position patient 18 so patient 18 can lie comfortably during the imaging process. Couch 14 houses mechanical as well as electrical components that allow patient 18 and couch 14 to be moved to the center of the magnet bore 16, to a point called isocenter 20, where the most uniform and sensitive area of magnet 12 is located and imaging commonly occurs.

Within the volume defined by main magnet is at least one gradient coil 22. Gradient coil 22 produces substantially linear spatially-varying magnetic fields within the main magnetic field that are coincidental with the direction of the main magnetic field but vary along the three orthogonal directions (x, y, z) of the Cartesian coordinate system. Radiofrequency (RF) transmit coil 24 produces a perturbing RF pulse across the examination region.

One or more RF receive coils 26, commonly called imaging coils, are typically placed within the vicinity of the patient during imaging. Imaging coil 26 is comprised of a series of inductive and capacitive elements and operates by resonating and efficiently storing energy at what is known as the Larmor frequency. Coil 26, is comprised of at least one, and usually more than one element typically made of a continuous piece of copper in a loop, butterfly, figure-eight, or other continuous geometric shape. The elements are positioned at various locations throughout coil 26.

When coil 26 is used for imaging purposes each element collects information from the time varying voltage induced by the magnetic moments within the anatomy of patient 18 nearest to that element. The information collected by each element is processed through the electronics within the MRI system on individual channels of the MRI system, which keep the information from each element separate throughout the imaging process. The information from each channel of the system is then processed by reconstruction software integrated with the MRI system to combine the single images from the channels to create a complete image of the anatomy of interest.

Occasionally more than one element's information can be combined within one channel of the MRI system, allowing a broader geographic range of the anatomy of the patient to be imaged, however this poses many problems known within the art, such as isolation of cross-talk between elements that overlap in the scope of the anatomy from which elements are collecting information, and cancellation of signal between elements. MRI systems and the reconstruction software they use are limited in their abilities to combine single images from the channels, and can only process a predetermined maximum number of channels to create the complete image of the anatomy of interest.

As the design of RF coils evolve, significantly more elements are being used, and significantly more complex element geometries are being constructed, often with numerous elements overlapping the same area of the coil. The number of elements that can be used during a single imaging scan may be limited by the predetermined maximum number of channels the MRI system and reconstruction software can process. As the number of elements used within coils increases, the number of possible element combinations used in each scan also increases. Because of current system limitations, this may require a decision of which elements should be combined to produce optimal images when more elements exist within the coil than can be utilized during a single scan.

Generally, the technologist desires to use the combination of elements that will produce the scan image with the highest signal to noise ratio (SNR) and best uniformity defining the desired anatomy of interest. Individual elements must be chosen for proper coverage over the anatomy of interest, and the channel gain must be adjusted to give even coverage over the anatomy of interest and decrease hot spots, which appear bright spots in the image, or voids, which appear as dark spots in the image, in the final image. Choosing the combination of elements to meet this result is not always a clear-cut process, as the combination of too many elements, or incorrect element combinations can lead to a decrease in SNR, a decrease in uniformity because of hot spots or signal voids caused by improper coverage of the anatomy of interest, signal cancellation, or a drastic increase in reconstruction time.

Ideally, the best process for selecting the optimal element combination would include acquiring information from all elements of the at least one RF coil and determining the optimal combination during reconstruction. Unfortunately, the limited number of receiver lines and reconstruction computer power prohibits this process. Currently, manual methods of selecting coil combinations are most commonly used. The technologist usually chooses the combination desired from a predetermined list of combinations labeled with the appropriate anatomy of interest. For example, the technologist imaging with a torso coil may choose between a thoracic spine mode with the elements best suited for that area being predetermined by the designer or supplier of the coil, or an abdomen mode with the elements best suited for imaging that area being predetermined. Other commercial systems allow for the technologist to select specific elements for the desired scan. Attempts have been made in the prior art to design an automatic element selection process, but to date the results have proven to be less than satisfactory.

Currently, different methods are used for selecting the best coil elements for a specific imaging situation. Selecting the best coil elements is generally complicated by smaller coil elements. The useful imaging region of a small coil element may appear in only a portion of the image field of view, making it difficult to recognize that the small element is contributing to the final image unless the entire field of view is considered instead of a single or series of single sample reference points. Ideally, all coil elements that might usefully contribute to the final image, or even a small portion of the final image, would be selected for the optimal combination of elements. For automatically selecting the best coil elements, a method of mapping the useful region of all coil elements and comparing the useful region of each element with the location of the image slices or volume to be acquired must be used.

There are a variety of methods for accomplishing the mapping of the elements, and the comparison with the desired imaged location. One method includes producing a map of each coil element's response and determining the intersection with the region to be imaged. Another option includes collecting the signals from the region to be imaged from all coil elements and determine which of the elements contribute good signal to the region to be imaged.

U.S. Pat. No. 5,138,260 (Molyneaux) describes computer controlled switching of multiple RF coils. The patent teaches techniques that attempt to determine element position from fiducial markers. Once the coil locations are determined, positions relative to the region of interest are computed and a lookup table of coil characteristics is referenced to determine if the element should be used. At least one shortcoming associated with this patent is that fixed coil geometries that have been characterized before the patient arrives must be used for the lookup table to function properly.

U.S. Pat. No. 6,223,065 (Misic) covers automatic coil element selection in large MRI coils. The automatic selection taught in this patent is based on pre-assigned anatomy and coil selection or finding the elements closest to isocenter or closest to the anatomy of interest. At least one deficiency of this patent is that no mechanism is provided for determining which elements are best or appropriate for the given situation, and no indication is provided for how elements contributing to only a small portion of the image will be selected.

U.S. Pat. No. 6,724,923 (Ma) describes the automatic selection of multi-receiver MR data using fast pre-scan data analysis. The coil selection method of this patent is based on MR signal considerations. As taught by this patent, the signal intensity of a low resolution image acquired of each element is used as the metric to determine whether the element should be used. The method can also be run using one k-space line K-space is the frequency space domain used during the reconstruction process. The patent also teaches of using a method of determining coil suitability by the distance of the element from the anatomy of interest, as measured by signal intensity. A variety of methods to threshold or compute metrics used to select or deselect coils is also proposed in the patent.

The Ma patent (U.S. Pat. No. 6,7,24,923) offers no indication for scaling each element for equal noise output, a critical component of any MR based selection method. The low resolution images collected through the method taught in the patent may not offer any region free of signal to measure noise for equalization. Channel gain is also not considered in this patent, nor is there any clear separation of the element selection and reconstruction stages.

In the article "The NMR Phased Array" as published in Magnetic Resonance in Medicine, Volume 16, pages 192-225 in 1990, Roemer et al. discuss methods of simultaneously acquiring data from a plurality of closely positioned RF receive coils and subsequently combining the data. The article suggests overlapping adjacent coils and utilizing low input impedance preamplifiers to all coils to eliminate the problematic interactions among nearby coils. The authors found that separately receiving, storing and combining the data from each of the coils with voxel-dependant weights found by mathematical algorithms obtained the highest SNR at all points of the image. This article discusses how coils should be combined for optimal results, however does not explain any methods for automatically selecting the appropriate optimal elements from the group of multiple elements.

Therefore, as shown in the Prior Art, there is still a need for a method to automatically select appropriate elements from a group of multiple elements to form the optimal combination of elements for optimal clinical images.

SUMMARY OF THE INVENTION

The invention provides an automated element selection process for selecting the optimal elements for the specific imaging situation that is closely coupled with the automatic receiver channel gain process, Optimal image quality within this process is defined in this invention in terms of SNR. In one embodiment, channel gain and element selection will combine into one automated pre-scan process that will simplify the scanner operation by eliminating the necessity of the user to manually select the desired coil elements, and allowing automated selection of the optimal coil elements by the user's indication of the desired anatomy of interest, such as positioning the image slices.

The automated method would offer a means of selecting the elements, also known as coil selection in the art, that best contribute to the optimal final combination of elements from the at least one RF coil being utilized for the MR imaging session. The first step of this process is quickly acquiring a series of one-dimensional (1D) projections over at least one angled direction within a slice to determine which elements are in the volume of interest. Commonly two projections will be acquired at approximately orthogonal angles. The noise levels of the scan can also be calculated for SNR computation purposes. Elements not contributing to the volume of interest as found from the 1D scans should be eliminated, as they are not producing any useful signal near the anatomy of interest. Next, coils that produce any useful signal must be identified. Selection of coils producing useful signals is the most complex step of the process. Elements can be ranked according to their degree of signal quality. There are various methods available for determining the ranking of the elements. After the selection of coils leading to the optimal combination, a verification scan should be run to ensure the proper combination was chosen.

It is an object of this invention to describe a method for automatically selecting the elements to form the optimal combination for production of the best quality image of the area of interest.

It is a further object of this invention to provide a method for combining the automatic selection of elements and automatically selecting the receiver channel gain for a scan It is another object of this invention to provide a method for selecting the combination of elements that provide the highest image quality as measured by SNR for an imaging scan.

It is yet a further object of this invention to provide a method for automatically selecting the elements to form the optimal combination using purely MR signal considerations and methods, with no use of geometric factors.

These and other objects of the present invention will become more readily apparent from a reading of the following detailed description taken in conjunction with the accompanying drawings wherein like reference numerals indicate similar parts, and with further reference to the appended claims.

BRIEF DESCRIPTION OF THE DRAWINGS

The invention may take physical form in certain parts and arrangements of parts, numerous embodiments of which will be described in detail in the specification and illustrated in the accompanying drawings which form a part hereof, and wherein.

DETAILED DESCRIPTION OF THE INVENTION

Figure 1:
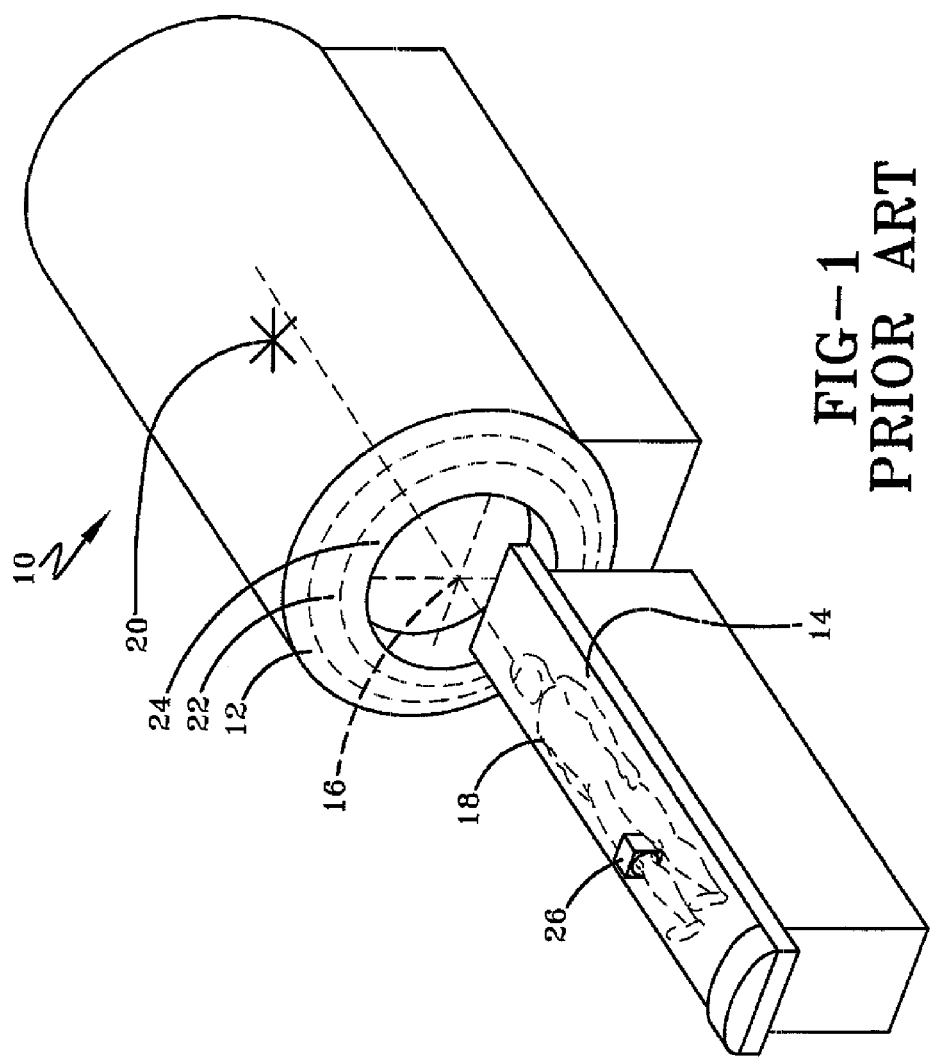
FIG. 1 is a magnetic resonance imaging (MRI) system of prior art.

Referring now to the drawings wherein the showings are for purposes of illustrating numerous embodiments of the invention only and not for purposes of limiting the same, the figures illustrate the novel idea of a method for automatic selection of elements in an RF coil within an MRI system.

Figure 2A:
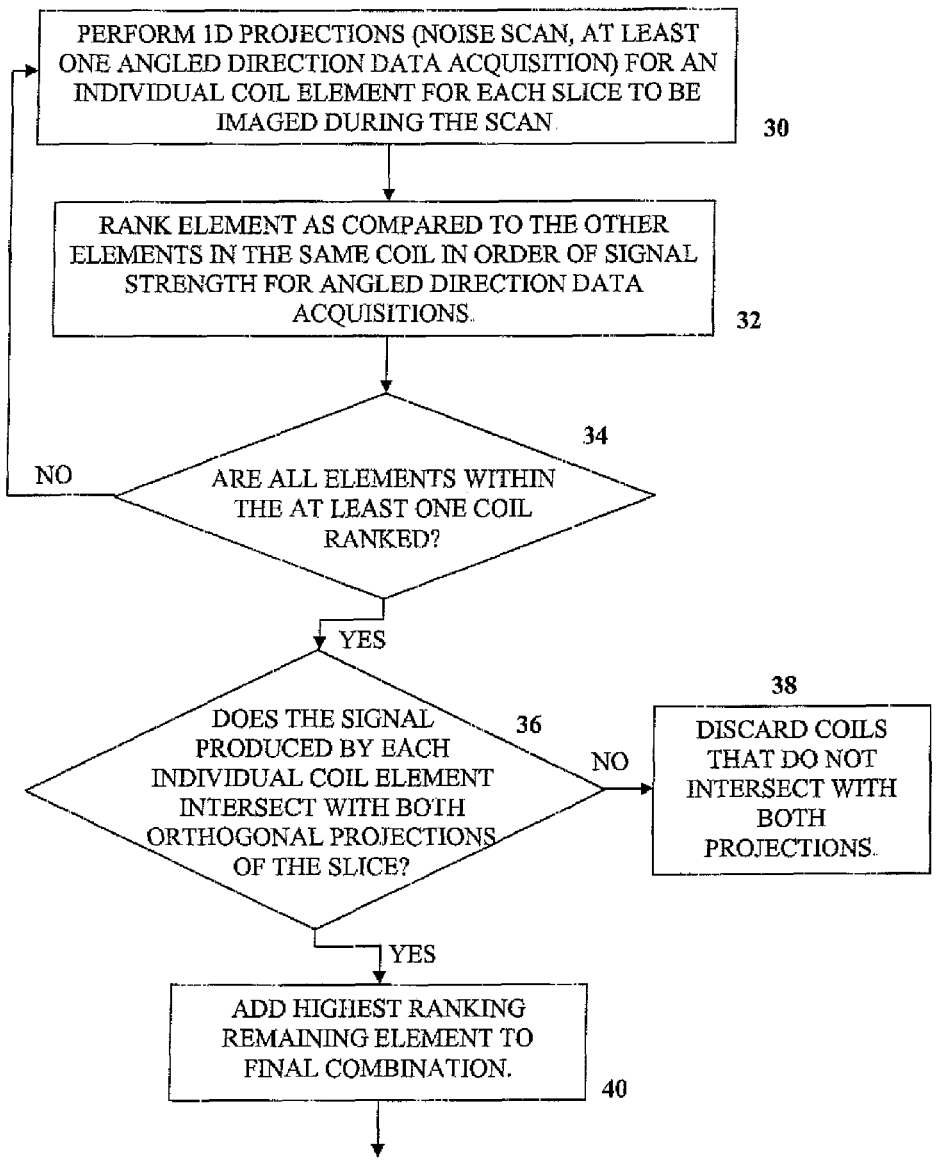
FIG. 2 (parts 2a and 2b) is a flowchart illustrating one embodiment of the automatic coil element selection and channel gain setting process of this invention.
Figure 2B:
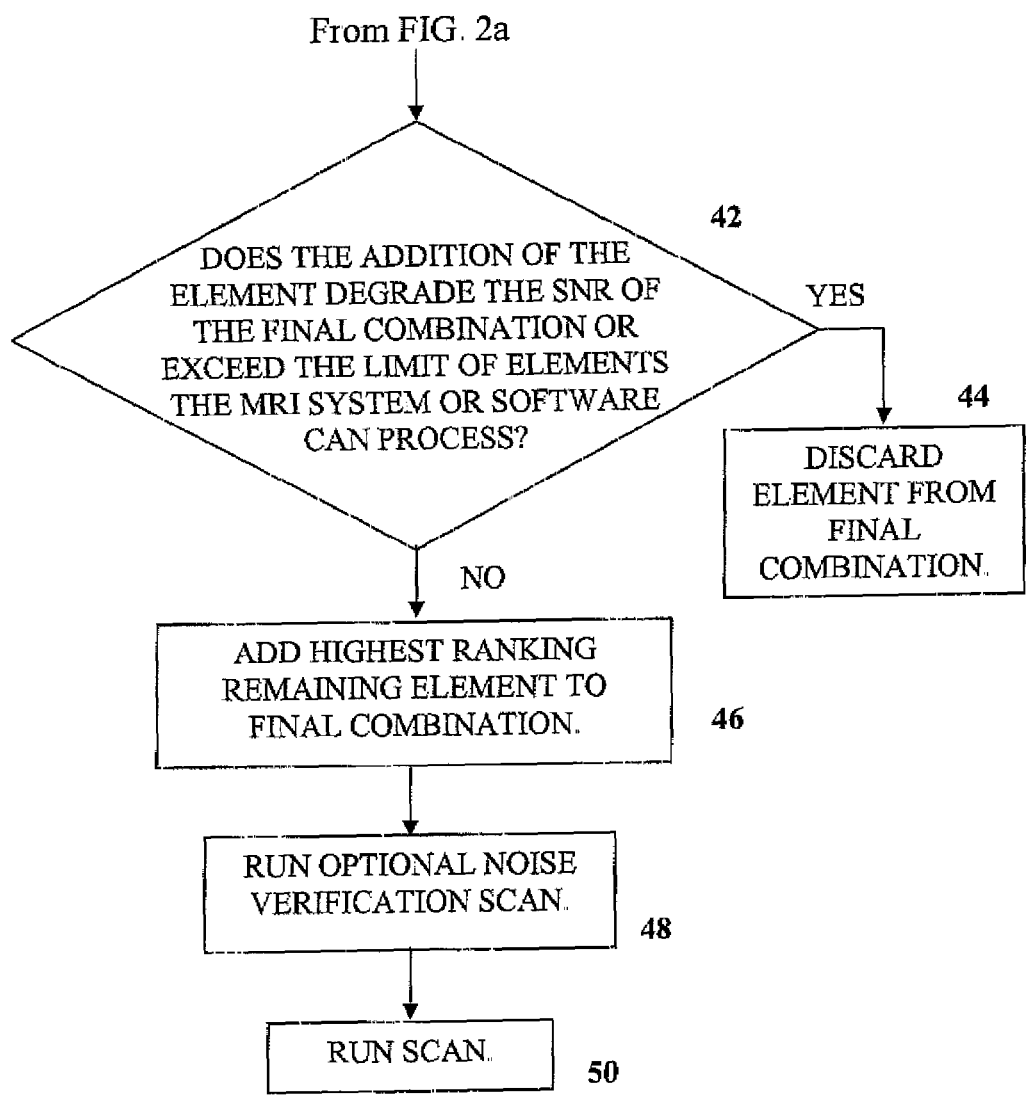

The automated coil selection process of this invention, as shown in the flowchart illustrated in FIGS. 2a and 2b, selects the optimal coil elements within one or more coils for the specific imaging situation. Throughout this disclosure the optimal coil elements are defined as those contributing to the final image with the highest SNR, however any objective measurement standard may be used, such as, but not limited to, image uniformity or signal value. In an embodiment of the process of automatically setting the receiver channel gain may be coupled with this coil selection process, in one pre-scan process. The coil selection process should be run before any scan having new geometry, such as slice position, field of view size, or image orientation. The selection process should also be run after any couch move including those where the imaging geometry remains constant, such as during run-off studies or whole-body studies that typically acquire scans in the transverse direction with constant imaging geometry. The calibration scans necessary for the selection process may be performed before any table move to expedite the process. The process of this invention applies to imaging with any RF coil using an MR scanner with the hardware having the ability to switch between coils and coil elements during the prescan and scan process. The switching of coils also requires the ability to introduce the channel gain factors that vary from slice to slice.

In one embodiment of the invention, the relative signal and noise contributions from each coil element must be determined. Multiple data acquisitions, as shown in step 30 of the flowchart in FIG. 2a, will be necessary for each slice or volume to be acquired. The first data acquisition will commonly be a simple noise acquisition used to set the receiver channel gain, with no RF and no gradient applied. This data acquisition is used to balance the output from all channels. The next data acquisitions will be a $0^{th}$ phase encode data readouts in at least one angled direction. Two $0^{th}$ phase encode data readouts will commonly be performed at separate angles, and will most commonly be in approximately orthogonal directions for maximum coverage of the desired imaging volume and the simplicity of calculations. However, more or less $0^{th}$ phase encode data readouts may be performed. At least one data readout must be performed, however as many as are necessary for the scanning application may be performed. For example, three data readouts are necessary to map the volume of the examination region. These data acquisitions will be used to determine whether the signal produced by each coil intersects the volume to be imaged. The last data acquisition is optional and will be an additional simple noise acquisition with no RF or gradient applied, to set the receiver channel gain given the final coil selection. This acquisition is a repeat of the first data acquisition, and is meant to account for any possible changes in loading of the coil that impact the noise characteristic of the selected coil elements. Throughout this application, the first and optional last scan may be collectively referred to as the noise scans, and the remaining $0^{th}$ phase encode data acquisition scans may be collectively referred to as the orthogonal projections.

As each of the orthogonal projections are acquired it will be obvious for each slice, that many coil elements are not producing useful signal to the desired imaging volume, only a few coils will clearly produce high signal, and several coils are producing reasonable signal levels. The coil elements clearly not producing useful signal to the desired imaging volume will be discarded from future calculations, as they will not be used in the optimal combination.

It must next be determined whether the signal producing coils are producing signal in the region of interest or if the projection is acquiring signal from a region outside the slice of interest. Considering both orthogonal projections together allows for the determination of whether the signal is within the slice of interest. The coil element will be selected if the signal is within the target region in both orthogonal projections, as that ensures the element is providing signal within the volume of interest. Using multiple orthogonal projections eliminates the previous necessity for collecting a low resolution image of the entire desired imaging region.

Assuming all channels have been calibrated, the amount of signal available from each coil element must be determined. Given two projections were taken through the imaging region, and assuming no aliasing in the read direction, the peak signal magnitude in the time domain data represents the average signal level. It is possible that a coil may exist with strong signal in other regions, however no coil will be chosen unless it produces signal in the target region. An ordered list of signal magnitude may be generated for each slice of all coil elements, in each orthogonal project taken, as shown in step 32 of FIG. 2a. In one embodiment of the invention the magnitude of the combination of both projects (RMS) will also be computed as a single figure of merit of each coil element. The list of elements (step 34 in FIG. 2a) will commonly show one element having the strongest signal within the region of interest, in both projections for each slice. This coil element will become the reference element for the given slice. The list will be further comprised of elements with high signal values in both orthogonal directions, but lower than the reference signal, elements with high signal value in one direction but low signal value in the orthogonal direction, and elements with low signal values in both directions. A high signal value is defined as any signal value of sufficient strength to be considered as contributing more than just noise to a clinical image. A low signal value is defined as a signal value of essentially zero, or with insufficient strength to contribute more signal than noise to a clinical image.

Elements with low signal value in both orthogonal directions should be discarded from future calculations, as shown in step 36 and 38 in FIG. 2a, as these elements do not contribute to the image in the field of view. Likewise, elements with low signal value in one projection should also be discarded, as those signals do not image in the field of view of one projection. The remaining elements with high signal value in both orthogonal directions must be examined further to determine whether the signal they produce is useful to a clinical image.

Though the examination of the remaining elements signal uses some SNR based image quality metric as the method of choice, other image quality metrics may also be considered, such as the benefits of motion artifact reduction or the total signal strength. Any method may be used for determining the coil signal quality of the remaining elements, examples of which are well known in the art.

A non-limiting example of the SNR threshold method utilizes the ratio of SNR between the target coil and the reference coil. This method uses a simple SNR threshold, eliminating coils whose ratios are below the set threshold and is useful for eliminating coils that are clearly not contributing useful signal. The threshold value may be any value determined to clearly indicate signal is added to the final clinical image.

Another embodiment of the invention uses an alternate method for determining the coil signal quality of the remaining elements. The second method includes completing SNR calculations that show how the addition of more coils impacts the global SNR. This method is necessary for determining the quality of intermediate signal level coil elements. When using the sum of the squares or root-mean-square (RMS) image combination methods well known in the art, the addition of each new coil will reduce the standard deviation of the noise by the square root of the number of channels used when the channels are contributing equal levels of noise. The channels may not be contributing equal noise in all situations.

The magnitude signal level of two coils can be combined by RMS, and the SNR computed for each projection and the combined RMS channel value. Each remaining coil can be included in the computation, as shown in steps 40 and 42 in FIG. 2a and FIG. 2b, noting how the addition of each extra channel down the ordered list of available coils will increase the average SNR of the image. It is expected that the SNR would rise as coils were added to some maximum number, then slowly drop as extra coils begin to add more noise than signal. The coils included in the computation at the point of the highest SNR should be included in the final image (step 46 in FIG. 2b), and those reducing the SNR should be discarded (step 44 in FIG. 2b). An optional noise verification scan can be run, as shown in step 48 of FIG. 2b. After the final coil combination is chosen, scanning will commonly commence, as shown in step 50 of FIG. 2b.

In practice the above method may not be suitable for all applications. Using smaller coil elements and larger field of views and matrix sizes increases the likelihood that coils will contribute to just a small portion of the final image. The SNR maximization process described above is global in nature. The process can be optimized by computing the Fast Fourier Transform (FFT) of each projection and computing the SNR compared with the number of coils used for each pixel along the projection to account for local variations. The FFT of the projection would have to be very heavily filtered or smoothed to get high SNR, to avoid the introduction of spurious results. To appropriately compare each coil in each projection, very high SNR is needed to ensure the SNR compared with the number of coils analysis can be easily interpreted. For example, images of the lung area have very low SNR, thus this method may not be appropriate.

However, this method allows the selection of all coils that give a meaningful contribution anywhere in the target image region and acquire data from all of those channels. Elements only having a meaningful contribution in sub-regions of the final image will most commonly be discarded. If these elements are desired in the final image, an image reconstruction optimization process will be needed.

Once the list of the best coil elements for optimal combination has been generated for each slice, it is necessary to reacquire all of the noise data calibration information for each individual slice so that the calibration reflects the actual coil combination. The reacquisition of noise data will account for changes in loading conditions from the initial acquisition, which was taken with all available coils on, to the final condition, with only the optimal selection set of coils on.

The coil selection process is not time consuming, and will not be a burden on the already existing pre-scan requirements. The noise scan acquisitions take no more than 1 second a piece. The two orthogonal projects will require approximately $1/128$ of the total scan time. As the typical scan averages approximately 4 minutes, the two orthogonal projections should take approximately 2 seconds each. In one embodiment of the invention the time required for pre-scan will be reduced, as the calibration process will not need to be run with the same sequence as the actual imaging sequence. Appropriate fast sequences can be selected and image geometry could be shared. Data from previous clinical scans or other types of calibrations might also be useful and can be shared. The time required may also be reduced by running the coil selection for every other slice, as opposed to every slice, as coil response does not change rapidly between slices.

Figure 3:
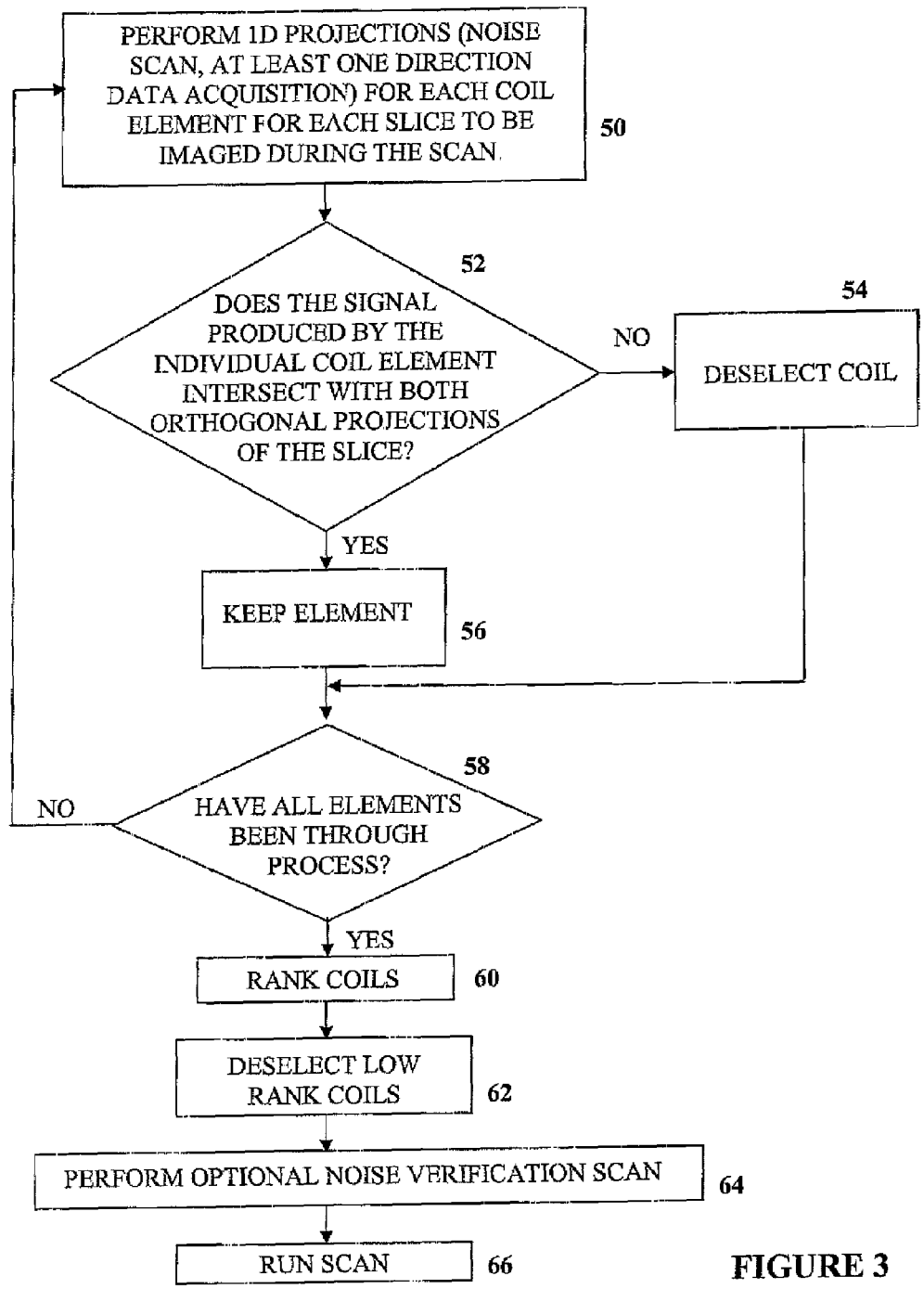
FIG. 3 is a flowchart illustrating another embodiment of the automatic coil element selection and channel gain setting process of this invention.

In a further embodiment of the invention, the steps of the process above can also be arranged in an alternate order, as shown in the flowchart in FIG. 3. The 1D data acquisitions can be taken as shown in step 50 of the flowchart. The elements that obviously do not contribute to the desired imaging area can be eliminated quickly after the four data acquisitions, as shown in steps 52 and 54, while the elements having a nominal or strong amount of signal in the desired imaging area, as shown by the orthogonal slices, will undergo further examination as shown in step 56 and 58. The remaining coils will then be ranked as in step 60 and the lowest ranking coils will be discarded from the final combination step 62. After the final coil combination is chosen a scan will typically commence, as shown in step 64 of FIG. 3.

Described above is a method for the automatic selection of elements within at least one radiofrequency (RF) coil used for imaging at least one slice of a volume using an MRI system which includes performing a 1D projection for at least two angles, preferably orthogonal, for each element of an initial selection of multiple elements; and using the projections in selecting and/or deselecting at least one element from the group of multiple elements for optimal imaging of the volume. Noise scans can also be utilized to set the receiver channel gain for imaging as part of the method. The elements can also be ranked, commonly using the element's SNR, with selection and/or deselection based on the ranking.

In the foregoing description, certain terms have been used for brevity, clearness, illustration and understanding; but no unnecessary limitations are to be implied therefrom beyond the requirements of the prior art, because such terms are used for descriptive purposes and are intended to be broadly construed. Moreover, this invention has been described in detail with reference to specific embodiments thereof including the respective best modes for carrying out each embodiment. It shall be understood that these illustrations are by way of example and not by way of limitation.

What is claimed is:

1. A method for the automatic selection of elements within at least one radiofrequency coil used for imaging at least one slice of a volume using a magnetic resonance imaging system that comprises the steps of:
   (a) performing a one-dimensional projection data acquisition for determining the noise level of each element of an initial selection of multiple elements;
   (b) performing a one-dimensional projection for at least one angle for each element of said initial selection of multiple elements;
   (c) using said angled projections in deselecting an element included in said multiple elements that does not image the volume to be imaged;
   (d) ranking said remaining elements by performance;
      (i) wherein steps (c) and (d) are performed in either order; and
   (e) using said ranking in selecting said elements from the multiplicity of remaining elements to form a combination of said elements for imaging said volume.

2. The method of claim 1 wherein
said deselection of elements is made when said element's signal does not intersect with either said angled one-dimensional projection.

3. The method of claim 1 wherein
said ranking of said remaining elements is based upon the signal to noise ratio of said element.

4. The method of claim 1 which further comprises
performing an additional one-dimensional projection data acquisition for confirming the noise level of said elements of said combination after said combination is chosen.

5. The method of claim 1 which further comprises
using said noise level acquisitions to set receiver channel gain for said imaging.

6. The method of claim 1 which further comprises
repeating said method for further slices of said volume.

7. The method of claim 1 which further comprises
utilizing data from previously acquired scans in said ranking of elements or said selecting of elements.

8. A method for the automatic selection of elements within at least one radiofrequency coil used for imaging at least one slice of a volume using a magnetic resonance imaging system which comprises:
   (a) performing a one-dimensional projection data acquisition for determining the noise level of each element of an initial selection of multiple elements;
   (b) performing a one-dimensional projection for at least two angles for each element of said initial selection of multiple elements; and
   (c) using said angled projections in deselecting an element included in said multiple elements that does not image the volume to be imaged.

9. The method of claim 8 which further comprises
using said angled projections in selecting said elements from the multiplicity of remaining elements to form a combination of said elements for imaging said volume.

10. The method of claim 8 which further comprises
performing an additional one-dimensional projection data acquisition for verifying the noise level of each element of said selected combination of the elements after said selection of the elements of said combination.

11. The method of claim 8 which further comprises
using said noise level acquisitions to set receiver channel gain for said imaging.

12. The method of claim 8 which further comprises
repeating said method for further slices of said volume.

13. A method for the automatic selection of elements within at least one radiofrequency coil used for imaging at least one slice of a volume using a magnetic resonance imaging system which comprises:
   (a) performing a one-dimensional projection for at least one angle for each element of an initial selection of multiple elements; and
   (b) using said projections in selecting at least one element from said multiple elements for imaging of said volume, wherein said at least one selected element is not selected from said projections that do not produce useful signal within the volume, and further wherein said at least one selected element is not selected from said projections that do not produce signal in a region of interest of the volume; and
   (c) performing an additional data acquisition for verifying said noise level of each said element.

14. The method of claim 13 which further comprises
performing at least one one-dimensional projection data acquisition for determining the noise level of each element of an initial selection of multiple elements before performing said one-dimensional projection for at least two angles for each element.

15. The method of claim 13 which further comprises
ranking said elements and selecting said elements based upon highest rank after performing said one-dimensional projections.

16. A method for the automatic selection of elements within at least one radiofrequency coil used for imaging at least one slice of a volume using a magnetic resonance imaging system which comprises:
   (a) performing at least one one-dimensional projection data acquisition for determining the noise level of each element of an initial selection of multiple elements;
   (b) performing a one-dimensional projection for at least two angles for each element of said initial selection of multiple elements; and
   (c) using said projections in selecting at least one element from said multiple elements for imaging of said volume.

* * * * *